United States Patent [19]

Chaki

[11] Patent Number: 4,463,619

[45] Date of Patent: Aug. 7, 1984

[54] CRANK MECHANSIM IN A PUSHBUTTON TUNER

[75] Inventor: Takao Chaki, Tokyo, Japan

[73] Assignee: Clarion Co., Ltd., Japan

[21] Appl. No.: 328,937

[22] Filed: Dec. 9, 1981

[30] Foreign Application Priority Data

Dec. 12, 1980 [JP] Japan ................................. 55-177587

[51] Int. Cl.³ ........................... H03J 5/12; G05G 1/02
[52] U.S. Cl. .................................... 74/10.33; 74/10.8;
74/440; 334/7
[58] Field of Search ...................... 74/10.33, 10.8, 440;
334/7

[56] References Cited

U.S. PATENT DOCUMENTS

| 2,222,789 | 11/1940 | Tyzzer | 74/10.33 |
| 2,898,767 | 8/1959 | Teaf | 74/10.33 |
| 3,634,791 | 1/1972 | Yasuda et al. | 334/7 |
| 3,635,097 | 1/1972 | Mears, Jr. | 334/7 X |

Primary Examiner—Allan D. Herrmann
Attorney, Agent, or Firm—Russell E. Hattis

[57] ABSTRACT

A crank mechanism in a pushbutton tuner is characterized in that a crank gear and a backlash preventing gear, both mounted on one associated end of crank bars of the pushbutton tuner, are formed with stepped-down portions so that teeth formed on them are positioned inward of the crank bars with respect to the base portions of the gears.

2 Claims, 5 Drawing Figures

CRANK MECHANSIM IN A PUSHBUTTON TUNER

BACKGROUND OF THE INVENTION

1. Field of the Invention

This invention relates to a crank mechanism in pushbutton tuner, and more particularly to a structure of a crank gear to be mounted on an end of the crank.

2. Description of the Prior Art

A pushbutton tuner is generally arranged to perform a tuning operation by rotating a crank to a predetermined extent by pushing a pushbutton, and thereby inserting a tuning core coupled to the crank into a coil. Further, in such a pushbutton tuner there is usually provided a manual tuning dial in addition to the above described tuning assembly using the pushbutton. When the drive is rotated, the crank is also rotated to the desired extent so as to tune the receiver to a station other than that selected by the pushbutton, and to perform fine adjustment during the tuning operation. In this case, if the crank is kept connected to the tuning dial during operation of the pushbutton, the load becomes so large to as disturb a smooth operation of the pushbutton. In this connection, there is often provided a clutch assembly between the crank and the tuning dial for releasing their engagement, thus reducing the load. That is, in such a conventional pushbutton tuner, the clutch assembly 1 is mounted outside a frame 2 of the tuner as shown in FIG. 1, and a clutch shaft 3 extending from the clutch assembly 1 is inserted within the frame 2 so that a clutch gear 4 fixed on one end of the clutch shaft 3 comes into meshing engagement with a sector crank gear 6 interlocking with crank bars 5. In accordance with the tendency of minimizing pushbutton tuners in size, it has been proposed to mount the clutch assembly nearer to the crank bars (within the frame, for example) thus to reduce the width of the tuner. In this case, the crank bars 5 cannot be shortened to less than a predetermined length, due to the number and the diameter of the tuning coils and the size of the pushbutton. Therefore, if the clutch assembly only is displaced deeper within the frame, the clutch gear is positioned so near to the crank bars to be disengageable with the crank gear.

OBJECT OF THE INVENTION

The present invention has been done in view of the above mentioned conventional situation and has as its object providing a crank mechanism in a pushbutton tuner in which a clutch gear is engageable with a crank gear even when positioned very near to crank bars.

SUMMARY OF THE INVENTION

In accordance with the present invention, there is provided a crank mechanism in a pushbutton tuner which comprises:
crank bars; and
a crank gear mounted on one pair of ends of said crank bars;
said crank gear having a stepped-down portion so that teeth formed thereon come into meshing engagement with a clutch gear of a manually tuning mechanism at a portion inward of said crank bars with respect to the base portions of said crank gear.

DETAILED DESCRIPTION OF THE DRAWINGS

The present invention will now be described in detail referring to the preferred embodiment illustrated in FIG. 2 and FIG. 3.

Figure 1:
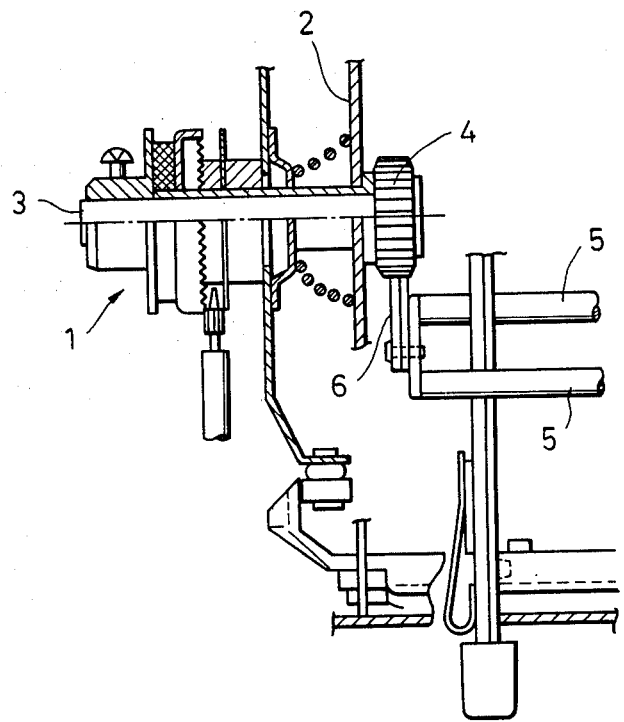
FIG. 1 shows a plan view illustrating a conventional crank mechanism in a pushbutton tuner.
Figure 2:
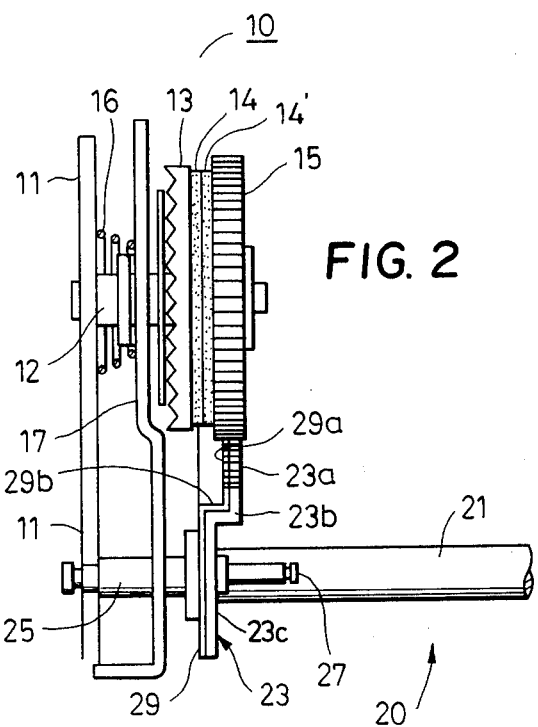
FIG. 2 shows a plan illustrating an embodiment of the crank mechanism according to the present invention.
Figure 3:
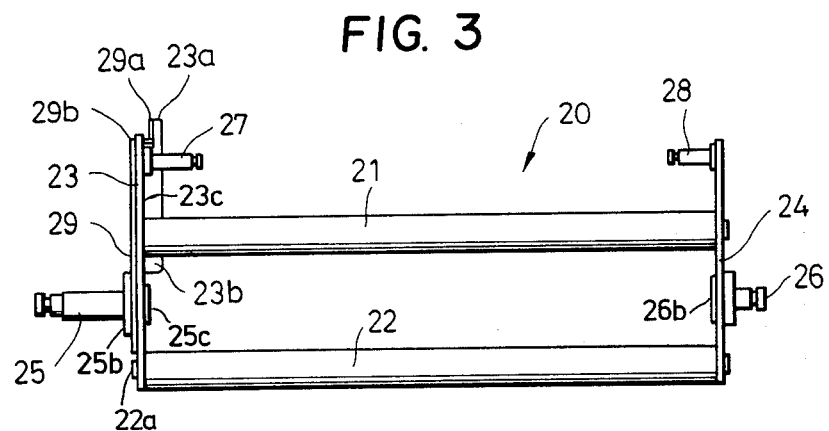
FIG. 3 shows a plan view illustrating the entire crank of FIG. 2.

In an automatically tuning mechanism generally designated by the reference numeral 10 in FIG. 2, the reference numeral 11 denotes a frame of a pushbutton tuner and 12 is a clutch shaft supported by the frame 11. On the clutch shaft 12 are pivotally mounted a crown gear 13 ex-interlocking with a manual tuning drive and clutch plates 14, 14' secured on the crown gear 13 and a clutch gear 15' respectively. On the end of the clutch shaft 12 within the frame 11 the clutch gear 15 is mounted in a manner pressing the clutch plates 14 and 14' to each other. A spring 16 and an unlocking lever 17 are provided between the crown gear 13 and the frame 11. The spring 16 pushes the crown gear 13 toward the clutch gear 15 and the releasing lever 17 is used to release the compressed condition between the crown gear 13 and the clutch gear 15 against the spring force of the spring 16.

Figure 4:
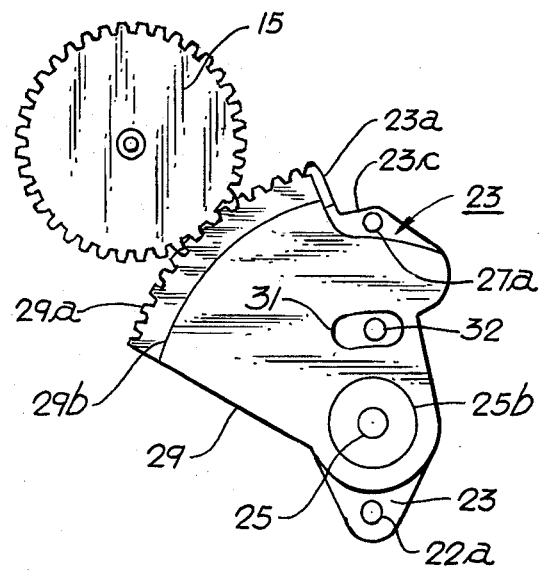
FIG. 4 is a side elevation view of the assembly of FIG. 3, showing an anti-backlash gear in overlying relationship with the crank gear of the assembly, the view of FIG. 4 as shown being rotated slightly clockwise with respect to the view of FIG. 3.
Figure 5:
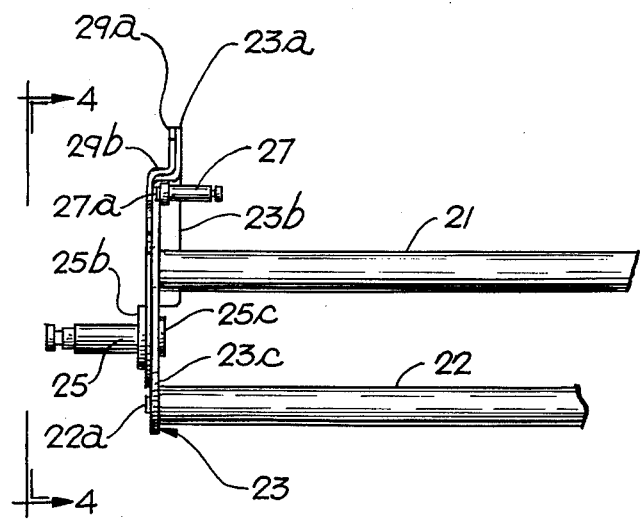
FIG. 5 is a similarly slightly rotated view of the leftmost region of FIG. 3 showing details of the overlying relationship of the elements of the assembly.

On the other hand, a crank mechanism generally designated by the reference numeral 20 has crank bars 21 and 22 laid in parallel with each other and side plates 23, 24 each secured on each associated end of the crank bars 21, 22, as for example by rivet means 22a and 32. The side plates 23 and 24 are formed with support shafts 25 and 26, respectively, outwardly extending to be pivotally supported by the frame 11. FIG. 3 shows support shafts 25 and 26 attached to side plates 23 and 24 by rivet means 25c and 26b respectively. The side plates 23 and 24 are further formed at the upper ends thereof with crank pins 27, 28, respectively, for engaging with a core assembling member the tuner. FIGS. 4 and 5 show crank pin 27 secured to side plate 23 by rivet means 27a.

In this embodiment, the side plate 23 adjacent to the clutch mechanism is commonly used as a crank gear. That is, the side plate 23 has a substantially sectorial configuration having teeth 23a at the outer periphery thereof. Further, the side plate 23 has a stepped-down portion 23b extending in parallel with the base portion 23c thereof in a deeper position within the frame 11 so that the teeth 23a formed thereon are positioned interior than to the ends of the crank bars 21, 22. As a result, the teeth 23a are in meshing engagement with the clutch gear 14 which is positioned interior of the ends of the crank bars 21 and 22 as shown in FIG. 2. On the outer end of the side plate 23 i.e. the crank gear there is mounted a backlash preventing gear 29 also having a stepped-down portion 29b so that they overlie each other in a nesting relationship. The backlash preventing gear 29 is pivotally mounted on the shaft 25 captively secured by shoulder 25b fixedly attached to shaft 25, and teeth 29a formed thereon are in meshing engagement with the clutch gear 14. A spring not shown is provided between the backlash preventing gear 29 and the side plate (crank gear) 23 for forcing the teeth 29a and the teeth 23a to the opposite directions so that the teeth 29a and 23a hold the teeth of the clutch gear therebetween to thereby prevent backlash between the crank gear (side plate) 23 and the clutch gear 14. An arcuate slot 31 in the anti-backlash gear 29 allows clearance for the rivet means 32 attaching shaft 21 to the crank gear 23.

As apparent from the above-described embodiment, the present invention provides a crank mechanism in which a crank gear and a backlash preventing gear mounted thereon are formed to have stepped-down portions so that teeth formed on them are positioned nearer to the crank bars than their base portions (portions for mounting on the crank bars with). Therefore, the present invention makes it possible to position a clutch gear for engagement with the teeth of the backlash preventing gear and the crank gear in a deeper portion within a frame of the tuner, resulting in reduction of width of the pushbutton tuner.

The above-described embodiment is so arranged that the stepped-down portions of the crank gear and the backlash preventing gear are deep enough with respect to the base portions to position the teeth interior to the ends of the crank bars, thus arranging the meshing portion as deep as possible. However, the depth of the stepped-down portions (the offset distance between the base portions and the stepped-down portions) may be determined as desired to be the same as or smaller than the thickness of the gears themselves, for example.

I claim:

1. In a pushbutton tuner having parallel crank bars joiningly attached together at the ends thereof in a spaced-apart relationship by a pair of side plates, said side plates having associated therewith pivotal mounting means for allowing rotation of said bars about an axis generally parallel thereto, crank gear means fixedly attached to one of said side plates, and a manual tuning mechanism having a drive gear, said drive gear being disposed in meshing engagement with said crank gear so that rotation of said drive gear rotates said crank bars about said axis, the improvement wherein:

said crank means comprises an integral extension of one of said side plates having an outer arcuate tooth-bearing portion thereof inwardly offset so that the teeth of said crank means are disposed about said axis of rotation and in a plane inboard of the associated crank bar ends.

2. The mechanism as claimed in claim 1 further comprising a backlash preventing gear generally overlying said crank gear.

* * * * *